(12) United States Patent
Li et al.

(10) Patent No.: US 9,395,577 B2
(45) Date of Patent: Jul. 19, 2016

(54) BACKLIGHT ASSEMBLY AND LIQUID CRYSTAL DISPLAY USING THE SAME

(71) Applicant: Shenzhen China Star Optoelectronics Technology Co., Ltd., Shenzhen, Guangdong (CN)

(72) Inventors: Dehua Li, Guangdong (CN); Yu-chun Hsiao, Guangdong (CN); Shih Hsiang Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 156 days.

(21) Appl. No.: 14/383,106

(22) PCT Filed: Jul. 3, 2014

(86) PCT No.: PCT/CN2014/081551
§ 371 (c)(1),
(2) Date: Sep. 4, 2014

(87) PCT Pub. No.: WO2015/196508
PCT Pub. Date: Dec. 30, 2015

(65) Prior Publication Data
US 2015/0378213 A1  Dec. 31, 2015

(30) Foreign Application Priority Data
Jun. 27, 2014 (CN) .......................... 2014 1 0302145

(51) Int. Cl.
*G02F 1/1335* (2006.01)
*H05K 1/02* (2006.01)

(52) U.S. Cl.
CPC .... *G02F 1/133603* (2013.01); *G02F 1/133615* (2013.01); *H05K 1/0203* (2013.01); *G02F 2001/133612* (2013.01); *G02F 2001/133628* (2013.01)

(58) Field of Classification Search
CPC ...................... G02F 1/133603; G02F 1/133612
See application file for complete search history.

(56) References Cited

U.S. PATENT DOCUMENTS

2013/0258251 A1* 10/2013 Lee ...................... H05K 1/0209
349/69

FOREIGN PATENT DOCUMENTS

CN  101220915 A  7/2008
CN  103148409 A  6/2013

* cited by examiner

*Primary Examiner* — Anne Hines
(74) *Attorney, Agent, or Firm* — Andrew C. Cheng

(57) ABSTRACT

A backlight assembly and an LCD using the same are provided. The backlight assembly comprises: a light source, a conductive copper layer, a dielectric layer, a metallic printed circuit board and a heat sink. The dielectric layer is attached to one side surface of the metallic printed circuit board. The conductive copper layer is mounted on the dielectric layer. The light source and the heat sink are respectively connected to the conductive copper layer. The light source utilizes the conductive copper layer to conduct electricity and to conduct the heat to the heat sink. The backlight assembly has the heat sink connecting to the light source through the conductive copper layer to shorten the heat dissipating path of the light source and to enhance the heat-dissipating efficiency of the light source. Moreover, for the narrow frame, the heat sink is directly welded to the bent metallic printed circuit board.

14 Claims, 3 Drawing Sheets

BACKLIGHT ASSEMBLY AND LIQUID CRYSTAL DISPLAY USING THE SAME

BACKGROUND OF THE INVENTION

1. Field of the Invention

The present invention relates to a technology filed of a liquid crystal display, especially to a backlight assembly and a liquid crystal display using the same.

2. Description of Related Art

To narrow the frame is one of the develop tendencies for liquid crystal display (LCD) televisions. A narrow frame allows the liquid crystal display television to have a larger visual area in the same outer length and outer width. Moreover, getting rid of the thick frame makes the appearance more stylish and beautiful.

When the liquid crystal displays pursue narrow frames, their internal structures also have higher requirement, especially to the heat sink structure of the backlight assembly. FIG. 1 is an illustrative view of a conventional backlight assembly for a conventional liquid crystal display. FIG. 2 is a partially enlarged view of the backlight assembly in FIG. 1. The backlight assembly comprises a back plate 910, a heat sink 920 and a light bar 930. With further reference to FIG. 3, FIG. 3 is an illustrative view of a heat conductive path of the conventional light source. In the prior art, the heat from a light source 931 on the light bar 930 is conducted sequentially through a copper layer 932, a dielectric layer 933, a metallic printed circuit 934, a heat-conductive glue 935, the heat sink 920 and the back plate 910 finally to an external environment 800. In this heat conductive path, the dielectric layer 933 and the heat-conductive glue 935 have larger heat-resistance so that they influence the heat-conductive efficiency seriously. If the heat of the light source is not dissipated timely, the lifespan and the light efficiency of the light source are decreased.

SUMMARY OF THE INVENTION

The embodiments of the present invention provide a backlight assembly and a display using the same to solve technical problem that the conventional light source has low heat dissipating efficiency.

To solve the aforementioned problem, the embodiment of the present invention provides a backlight assembly. The backlight assembly comprises: a light source, a conductive copper layer, a dielectric layer, a metallic printed circuit board and a heat sink. The dielectric layer is attached to one side surface of the metallic printed circuit board. The conductive copper layer is mounted on the dielectric layer. The light source and the heat sink are respectively connected to the conductive copper layer.

According to a preferred embodiment of the present invention, the metallic printed circuit board is bent in L-shape. The light source, the conductive copper layer, the dielectric layer and the heat sink are mounted on a side where the metallic printed circuit board is bent to. The light source and the heat sink are mounted respectively on two sides of the bent L-shaped metallic printed circuit board.

According to a preferred embodiment of the present invention, surfaces of the heat sink that are not connected to the conductive copper layer are coated with an insulating paint.

According to a preferred embodiment of the present invention, the backlight assembly further comprises an insulating layer. The insulating layer is mounted on a surface of the conductive copper layer.

According to a preferred embodiment of the present invention, the light source is an LED light.

According to a preferred embodiment of the present invention, the light sources and the heat sinks are both more than one and are arranged in sequence along a longitudinal aspect of the metallic printed circuit board.

According to a preferred embodiment of the present invention, the LED light further comprises an LED land connected to the conductive copper layer, an LED chip attached to the LED land, and an LED gel shell mounted around the LED land and the LED chip.

According to a preferred embodiment of the present invention, the heat sink includes a heat-absorbing segment and multiple heat-dissipating segments. A bottom surface of the heat-absorbing segment is connected to the conductive copper layer. The heat-dissipating segments are formed in interval on a top surface of the heat-absorbing segment.

To solve the aforementioned problem, the embodiment of the present invention also provides a liquid crystal display. The liquid crystal display comprises a liquid crystal module and a backlight assembly. The backlight assembly comprises: a light source, a conductive copper layer, a dielectric layer, a metallic printed circuit board and a heat sink. The dielectric layer is attached to one side surface of the metallic printed circuit board. The conductive copper layer is mounted on the dielectric layer. The light source and the heat sink are respectively connected to the conductive copper layer.

According to a preferred embodiment of the present invention, the metallic printed circuit board is bent in an L-shape. The light source, the conductive copper layer, the dielectric layer and the heat sink is mounted on a side where the metallic printed circuit board is bent to. The light source and the heat sink are respectively mounted on two sides of the bent L-shaped metallic printed circuit board.

According to a preferred embodiment of the present invention, surfaces of the heat sink that are not connected to the conductive copper layer are coated with an insulating paint.

According to a preferred embodiment of the present invention, the backlight assembly further comprises an insulating layer. The insulating layer is mounted on a surface of the conductive copper layer.

According to a preferred embodiment of the present invention, the light source is an LED light.

According to a preferred embodiment of the present invention, the light sources and the heat sinks are more than one and are arranged in sequence along a longitudinal aspect of the metallic printed circuit board.

According to a preferred embodiment of the present invention, the LED light further comprises an LED land connected to the conductive copper layer, an LED chip attached to the LED land, and an LED gel shell mounted around the LED land and the LED chip.

According to a preferred embodiment of the present invention, the heat sink includes a heat-absorbing segment and multiple heat-dissipating segments. A bottom surface of the heat-absorbing segment is connected to the conductive copper layer. The heat-dissipating parts are formed in interval on a top surface of the heat-absorbing segment.

Comparing to the prior art, the backlight assembly in accordance with the present invention has the heat sink connecting to the light source through the conductive copper layer to shorten the heat dissipating path of the light source and to enhance the heat-dissipating efficiency of the light source. On the premise of requiring the narrow frame for the display, the heat sink is directly welded to dissipate heat.

DETAILED DESCRIPTION OF THE PREFERRED EMBODIMENT

The present invention is further described in detail with the drawings and the embodiments. In particular, the embodiments below are only used to illustrate the present invention, but not to limit the scope of the present invention. Similarly, the embodiments below are only partial embodiments of the present invention but not whole embodiments of the present invention. The other embodiments that the ordinary person skilled in this art obtained without devoting creative effort are belong to the protection scope of the present invention.

Figure 4:
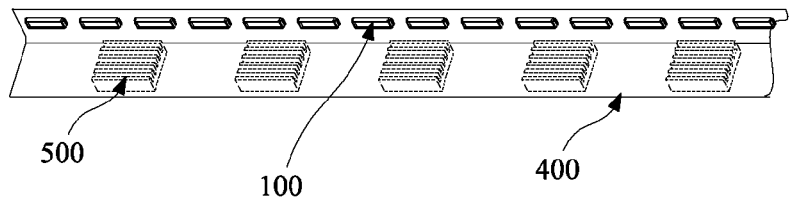
FIG. 4 is an illustrative view of the structure of a preferred embodiment of a backlight assembly in accordance with the present invention.
Figure 5:
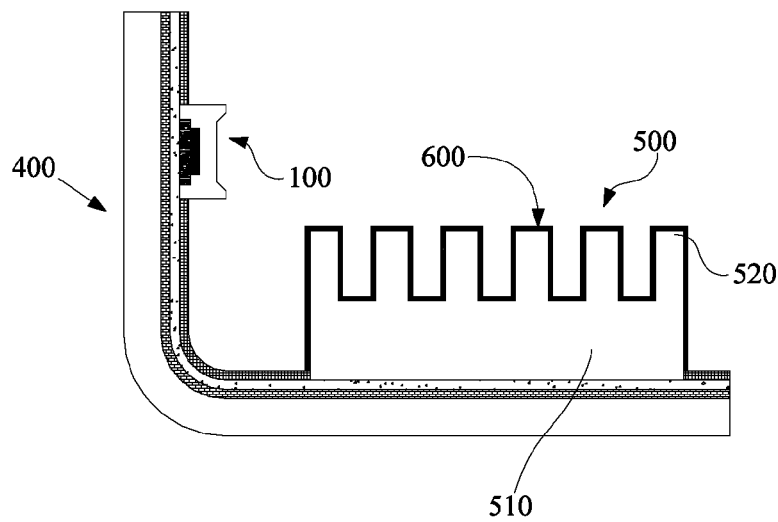
FIG. 5 is an enlarged view in partial section of the backlight assembly in FIG. 4.
Figure 6:
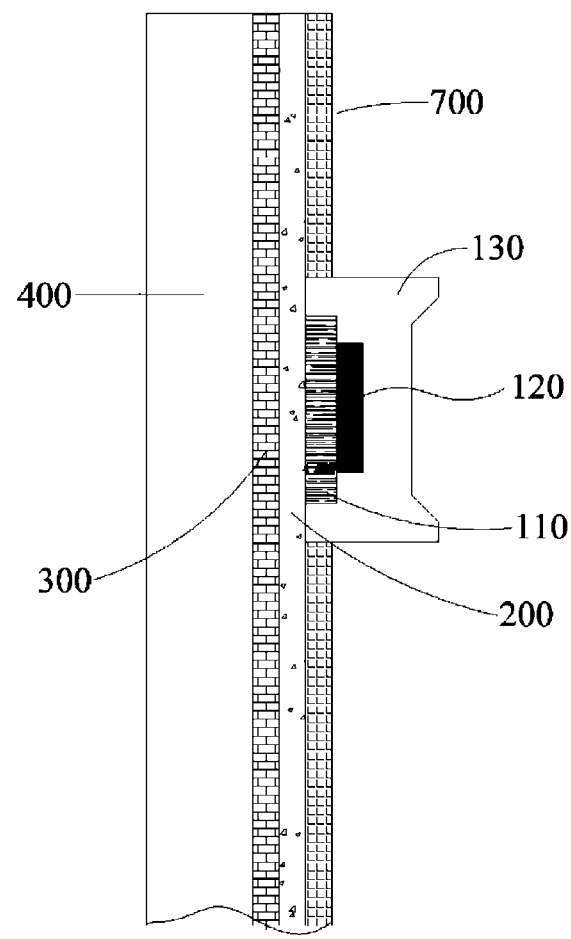
FIG. 6 is a partially enlarged view in partial section of the backlight assembly in FIG. 4.

With further reference to FIGS. 4 to 6, FIG. 4 is an illustrative view of the structure of a preferred embodiment of a backlight assembly in accordance with the present invention. FIG. 5 is an enlarged view in partial section of the backlight assembly in FIG. 4. FIG. 6 is a partially enlarged view in partial section of the backlight assembly in FIG. 4. The backlight assembly comprises a light source 100, a conductive copper layer 200, a dielectric layer 300, a metallic printed circuit board 400 and a heat sink 500.

Specifically, the metallic printed circuit board 400 is bent in an L-shape. The dielectric layer 300 is attached to a side surface of the metallic printed circuit board 400. In a preferred embodiment, the dielectric layer 300 is attached on the side surface that the metallic printed circuit board is bent to. The conductive copper layer 200 is further mounted on the dielectric layer 300. The light source 100 is connected to the conductive copper layer 200 and is electrically conducted through the conductive copper layer 200. The heat sink is also connected to the conductive copper layer 200. The heat generated by the light source 100 is conducted to the heat sink 500 through the conductive copper layer 200. The heat sink 500 dissipates heat for the backlight assembly.

Figure 7:
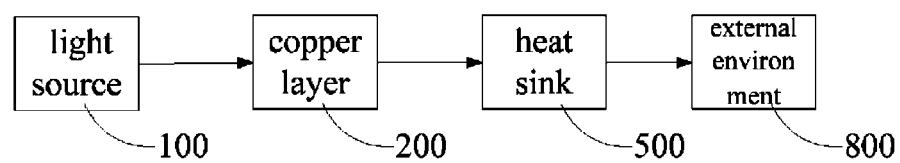
FIG. 7 is an illustrative view of a heat conductive path of a light source of the backlight assembly in accordance with the present invention.

With reference to FIG. 7, FIG. 7 is an illustrative view of a heat conductive path of a light source of the backlight assembly in accordance with the present invention. The heat from the light source 100 is conducted sequentially from the light source 100 through the copper layer 200 and the heat sink 300, and is finally conducted to the external environment 800. Comparing to the prior art, the heat conducting path of the embodiment of the present invention is shorter to have better heat conducting efficiency.

Figure 1:
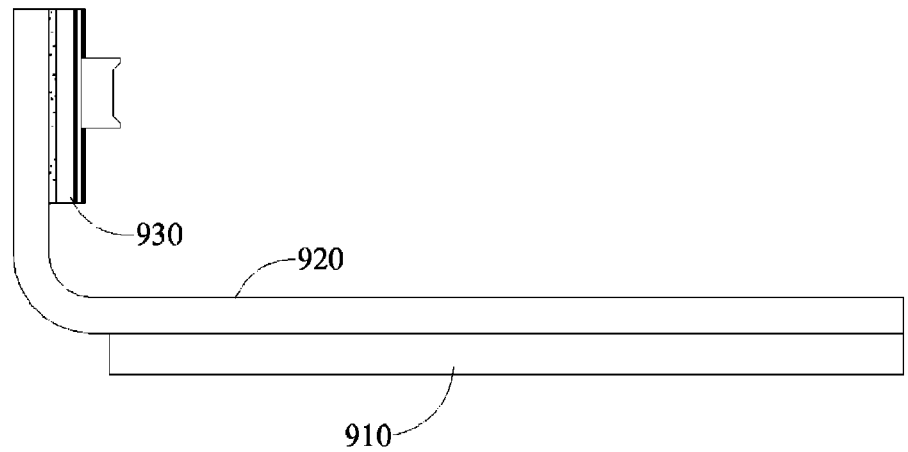
FIG. 1 is an illustrative view of the structure of a conventional backlight assembly of the conventional liquid crystal display.
Figure 2:
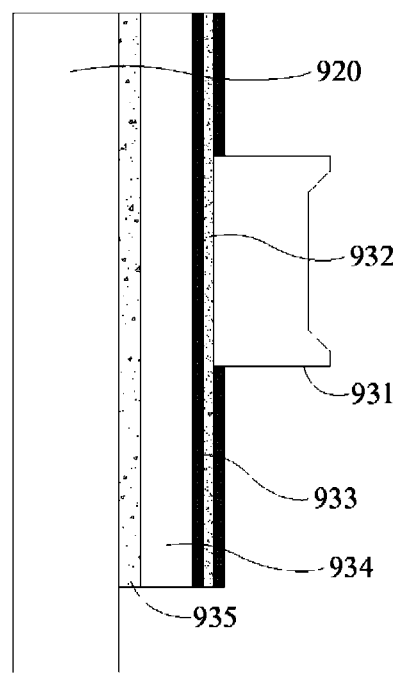
FIG. 2 is a partially enlarged view of the backlight assembly in FIG. 1.
Figure 3:
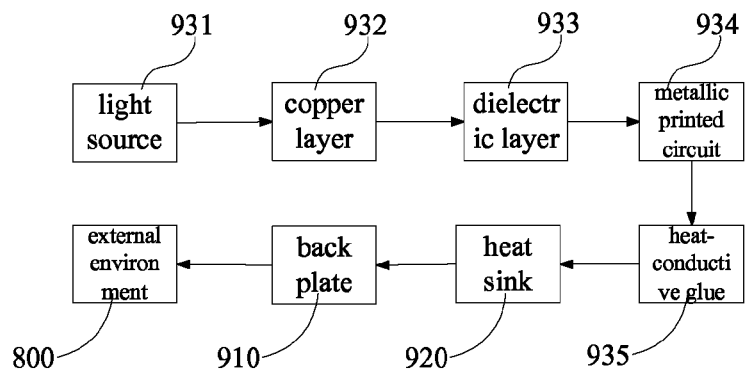
FIG. 3 is an illustrative view of a heat conductive path of the conventional light source.

In a preferred embodiment of the present invention, the light source 100, the conductive copper layer 200, the dielectric layer 300 and the heat sink 500 are mounted on a side where the metallic printed circuit board 400 is bent to. With reference to FIG. 3, the light sources 100 and the heat sinks 500 are both more than one and are arranged in sequence along a longitudinal aspect of the metallic printed circuit board 400. The light source 100 and the heat sink 500 are respectively mounted on two sides of the bent L-shaped metallic printed circuit board 400.

The heat sink 500 includes a heat-absorbing segment 510 and multiple heat-dissipating segments 520. A bottom surface of the heat-absorbing segment 510 is connected to the conductive copper layer 200, and may be connected by welding. The heat-dissipating segments 520 are formed in interval on a top surface of the heat-absorbing segment 510 to form heat dissipating gaps so that the heat dissipating area of the heat sink is increased.

Because the heat sink 500 is directly connected to the conductive copper layer 200, the heat sink 500 is in the electric conducting path of the light source 100 and is electricity conducted. To further prevent the heat sink 500 from electric leakage, surfaces of the heat sink 500 that are not connected to the conductive copper layer 200 are coated with an insulating paint 600. The insulating paint 600 electrically insulates the heat sink 500 with the external environment and increases the thermal radiation coefficient of the heat sink 500. The thermal radiation coefficient of the heat sink 500 is related to the insulating paint 600 coated on the surfaces of the heat sink 500. When the insulating paint 600 has deeper color and the heat sink 500 has rougher surfaces, the thermal radiation coefficient of the heat sink 500 is larger. The black insulating paint with higher roughness is preferable.

In other embodiments, the heat sink 500 is not only mounted on the same side of the metallic printed circuit board 400 with the light source 100. To have better heat dissipating effect, the heat sink 500 and the light source 100 are mounted respectively on two sides of the metallic printed circuit board 400 to be exposed to air. Correspondingly, through holes are formed through the metallic printed circuit board 400 and the dielectric layer 300 to allow the heat sink 500 to protrude through the metallic print circuit board 400 and the dielectric layer 300 and to connect to the conductive copper layer 200. Therefore, the light source 100 and the heat sink 500 are also connected through the conductive copper layer 200. A fan may be mounted on an end of the metallic printed circuit board 400 (not shown in FIGs). The fan blows to the heat sink 500 to further enhance the heat efficiency of the heat sink 500. Concrete structures are within the knowledge of the person skilled in the art and are not described details here.

With reference to FIG. 6, the light source is an LED light. The LED light further comprises an LED land 110, an LED chip 120 and an LED gel shell 130. Specifically, the LED land 110 is welded to the conductive copper layer 200. The LED chip 120 is attached to the LED land 110. The LED gel shell 130 is mounted around the LED land 110 and the LED chip 120.

Furthermore, the backlight assembly further comprises an insulating layer 700 mounted on an outer surface of the conductive copper layer 200. The insulating layer 700 keeps the conductive copper layer 200 from electricity leakage.

The backlight assembly in accordance with the present invention has the heat sink connecting to the light source through the conductive copper layer to shorten the heat dissipating path of the light source and to enhance the heat-dissipating efficiency of the light source. Moreover, on the premise of requiring the narrow frame for the display, the heat sink is directly welded to dissipate heat by using the bent metallic printed circuit board. The heat sink also has the insulating paint coated on the outer surface thereof to increase the thermal radiation coefficient of the heat sink.

Furthermore, the present invention also claims a liquid crystal display. The liquid crystal display comprises the backlight assembly as described in aforementioned embodiments. The other structures of the liquid crystal display are within the knowledge of the person skilled in the art and are not described details here.

An aforementioned description only involves one embodiment of the present invention and therefore does not limit the protection scope of the present invention. Every equivalent device or equivalent procedure utilizing specification and FIGs of the present invention to function as is varied, or use in other relevant technical fields directly or indirectly, the same includes within the scope of patent protection of the present invention.

What is claimed is:

1. A backlight assembly characterized in that the backlight assembly comprises: a light source, a conductive copper layer, a dielectric layer, a metallic printed circuit board and a heat sink; the dielectric layer is attached to one side surface of the metallic printed circuit board; the metallic printed circuit board is bent in an L-shape to form an inner bend side; the light source, the conductive copper layer, the dielectric layer and the heat sink are mounted on the inner bend side of the metallic printed circuit board; the light source and the heat sink are mounted respectively on two sides of the bent L-shaped metallic printed circuit board; the conductive copper layer is mounted on the dielectric layer; the light source and the heat sink are respectively connected to the conductive copper layer; surfaces of the heat sink that are not connected to the conductive copper layer are coated with an insulating paint.

2. The backlight assembly as claimed in claim 1 characterized in that the backlight assembly further comprises an insulating layer mounted on a surface of the conductive copper layer.

3. The backlight assembly as claimed in claim 2 characterized in that the light source is an LED light.

4. The backlight assembly as claimed in claim 3 characterized in that the light sources and the heat sinks are both more than one and are arranged in sequence along a longitudinal aspect of the metallic printed circuit board.

5. The backlight assembly as claimed in claim 4 characterized in that the LED light further comprises an LED land connected to the conductive copper layer, an LED chip attached to the LED land, and an LED gel shell mounted around the LED land and the LED chip.

6. The backlight assembly as claimed in claim 5 characterized in that the heat sink includes a heat-absorbing segment and multiple heat-dissipating segments; a bottom surface of the heat-absorbing segment is connected to the conductive copper layer; the heat-dissipating segments are formed in interval on a top surface of the heat-absorbing segment.

7. A liquid crystal display characterized in that the liquid crystal display comprises a liquid crystal module and a backlight assembly comprising: a light source, a conductive copper layer, a dielectric layer, a metallic printed circuit board and a heat sink; the dielectric layer is attached to one side surface of the metallic printed circuit board; the conductive copper layer is mounted on the dielectric layer; wherein the light source is connected to the conductive copper layer and is electrically conducted through the conductive copper layer, and the heat sink is directly connected to the conductive copper layer.

8. The liquid crystal display as claimed in claim 7 characterized in that the metallic printed circuit board is bent in an L-shape to form an inner bend side; the light source, the conductive copper layer, the dielectric layer and the heat sink are mounted on the inner bend side of the metallic printed circuit board; the light source and the heat sink are respectively mounted on two sides of the bent L-shaped metallic printed circuit board.

9. The liquid crystal display as claimed in claim 7 characterized in that surfaces of the heat sink that are not connected to the conductive copper layer are coated with an insulating paint.

10. The liquid crystal display as claimed in claim 7 characterized in that the backlight assembly further comprises an insulating layer mounted on a surface of the conductive copper layer.

11. The liquid crystal display as claimed in claim 10 characterized in that the light source is an LED light.

12. The liquid crystal display as claimed in claim 11 characterized in that the light sources and the heat sinks are both more than one and are arranged in sequence along a longitudinal aspect of the metallic printed circuit board.

13. The liquid crystal display as claimed in claim 12 characterized in that the LED light further comprises an LED land connected to the conductive copper layer, an LED chip attached to the LED land, and an LED gel shell mounted around the LED land and the LED chip.

14. The liquid crystal display as claimed in claim 13 characterized in that the heat sink includes a heat-absorbing segment and multiple heat-dissipating segments; a bottom surface of the heat-absorbing segment is connected to the conductive copper layer; the heat-dissipating segments are formed in interval on a top surface of the heat-absorbing segment.

* * * * *